United States Patent [19]

Rastegar

[11] Patent Number: 5,578,962
[45] Date of Patent: Nov. 26, 1996

[54] INSTRUMENTATION AMPLIFIER FOR SENSOR SIGNAL CONDITIONING USING LOW-COST, HIGH-ACCURACY ANALOG CIRCUITRY

[75] Inventor: Ali J. Rastegar, Gilroy, Calif.

[73] Assignee: MCA Technologies, Inc., Santa Clara, Calif.

[21] Appl. No.: 438,635

[22] Filed: May 10, 1995

[51] Int. Cl.$^6$ ................................................. H03F 3/45
[52] U.S. Cl. ............................ 330/9; 330/146; 330/260; 73/708; 73/721
[58] Field of Search ................................ 330/9, 146, 260; 73/708, 721

[56] References Cited

U.S. PATENT DOCUMENTS

| | | | |
|---|---|---|---|
| 3,419,809 | 12/1968 | Lach et al. | 330/260 X |
| 3,845,404 | 10/1974 | Trilling | 330/258 X |
| 4,195,266 | 3/1980 | Bingham | 330/9 |
| 4,574,250 | 3/1986 | Senderowicz | 330/51 X |
| 5,136,255 | 8/1992 | Fattaruso et al. | 330/9 |
| 5,142,238 | 8/1992 | White | 330/9 |
| 5,146,788 | 9/1992 | Raynes | 73/708 |
| 5,233,311 | 8/1993 | Chevallier | 330/260 X |
| 5,293,169 | 3/1994 | Baumgartner et al. | 330/9 X |

OTHER PUBLICATIONS

Baskett, et al., *Integrated Sensors Today and Tomorrow*, Senors, Mar. 1991.
I.C. Sensors, *Temperature Compensation, IC Pressure Sensors*, I. C. Sensors, Inc., Application Note: TN–002, Nov. 1983.
Nagara;, K., *A Parasitic–Insensitive Area–Efficient Approach to Realizing Very Large Time Constants in Switched–Capacitor Circuits*, IEEE Transactions on Circuits and Systems, 36, 9:1210–1216, Sep. 1989.

Tanigawa, Hiroshi, et al., *MOS Integrated Silicon Pressure Sensor*, IEEE Transactions on Electron Devices, 32, 7:1191–1194, Jul. 1985.

*Primary Examiner*—James B. Mullins
*Attorney, Agent, or Firm*—Burns, Doane, Swecker & Mathis, LLP

[57] ABSTRACT

A differential amplifier circuit that exhibits low temperature drift and a wide dynamic range includes a differential amplifier having first and second input terminals, first and second circuit nodes operatively connected to the first and second input terminals, respectively, a differential input signal pair, first and second sampling capacitors and a switching circuit. During a first operational phase, the switching circuit connects, a first plate of the first capacitor to a first input signal of the differential input signal pair, connects a first plate of the second capacitor to a second input signal of the differential input signal pair, and connects second plates of the first and second capacitors to a reference voltage. During a second operational phase, the switching circuit connects the first plate of the first capacitor to the second input signal of the differential input signal pair, connects the first plate of the second capacitor to the first input signal of the differential input signal pair, and connects the second plates of the first and second capacitors to respective ones of the first and second circuit nodes. In accordance with another embodiment of the invention, a sensor correction circuit for producing a corrected sensor output signal includes the differential amplifier circuit previously described and a bridge sensor that produces as an output signal the differential input signal pair of the amplifier circuit. A portion of the bridge voltage is used to form a connection voltage used to correct the sensor output signal.

23 Claims, 4 Drawing Sheets

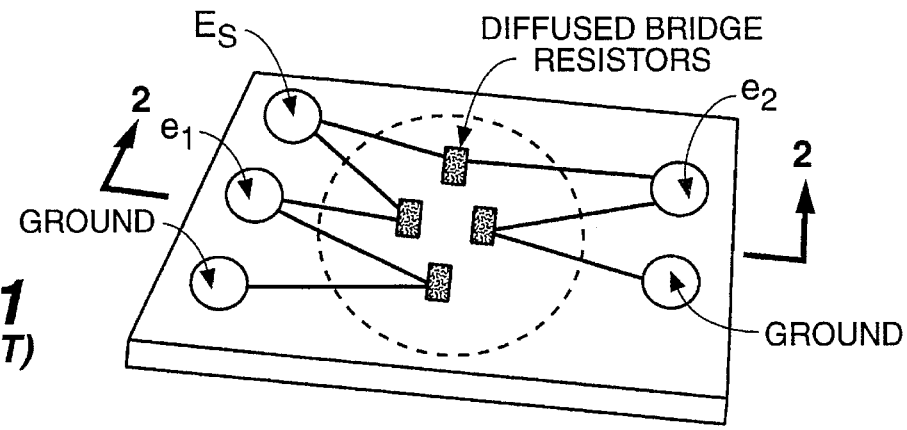
FIG._1
*(PRIOR ART)*
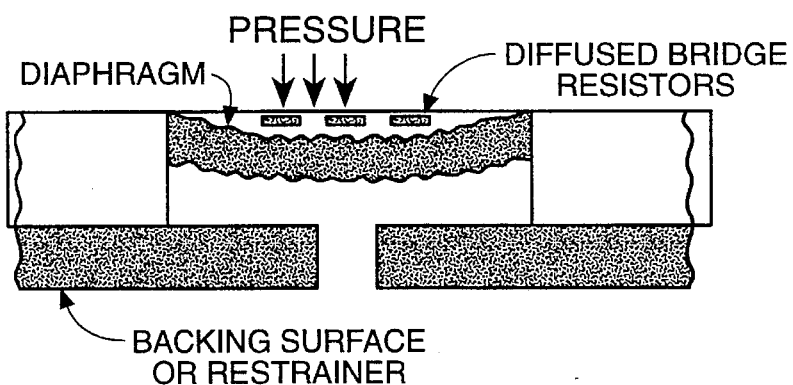
FIG._2
*(PRIOR ART)*
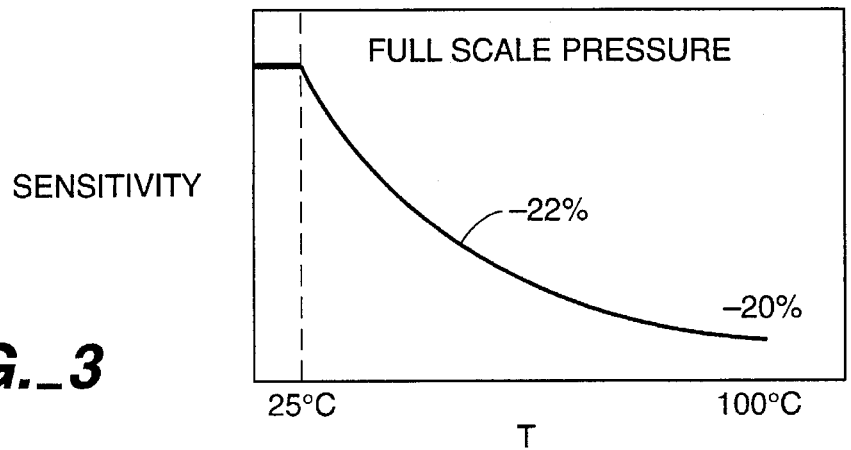
FIG._3

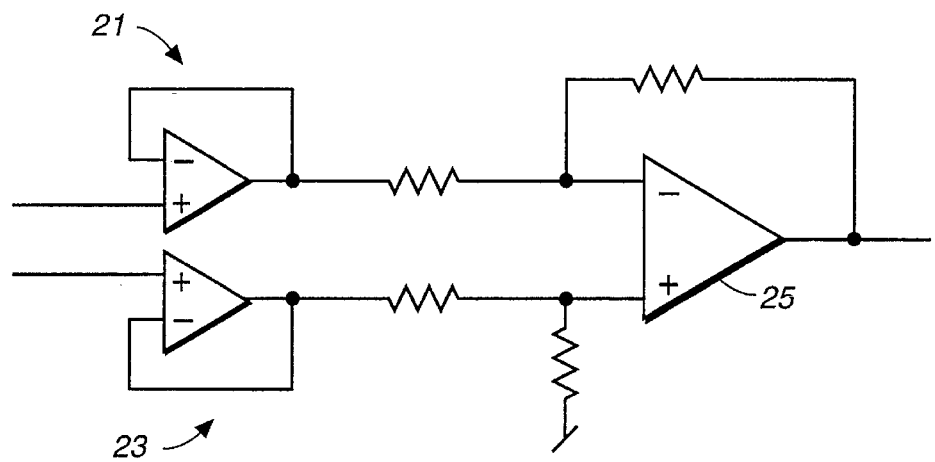
FIG._4 (PRIOR ART)
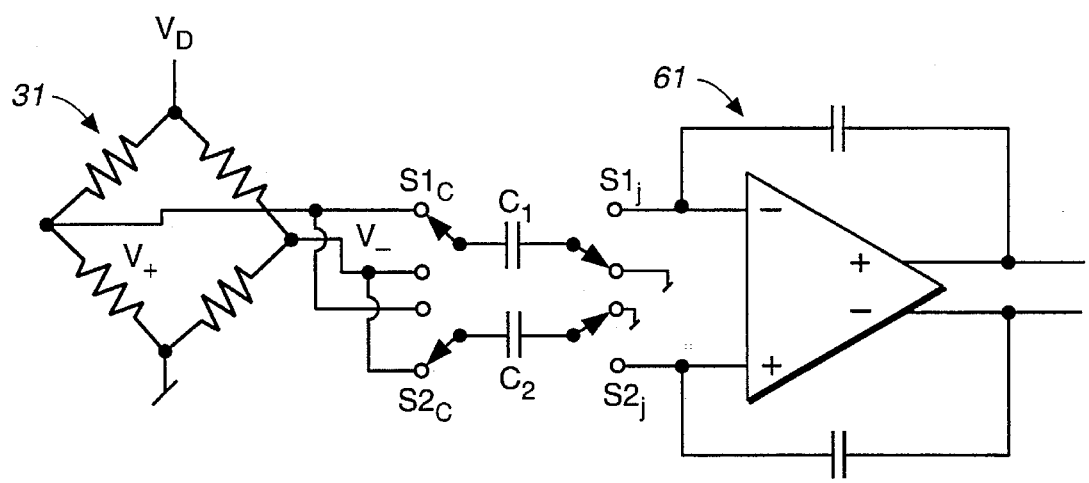
FIG._6
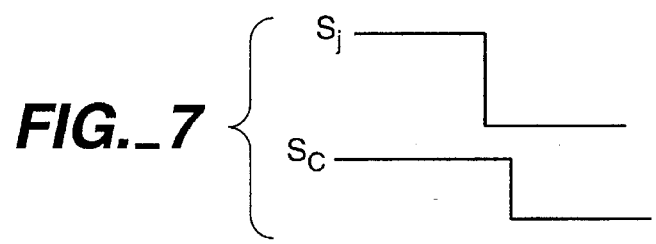
FIG._7

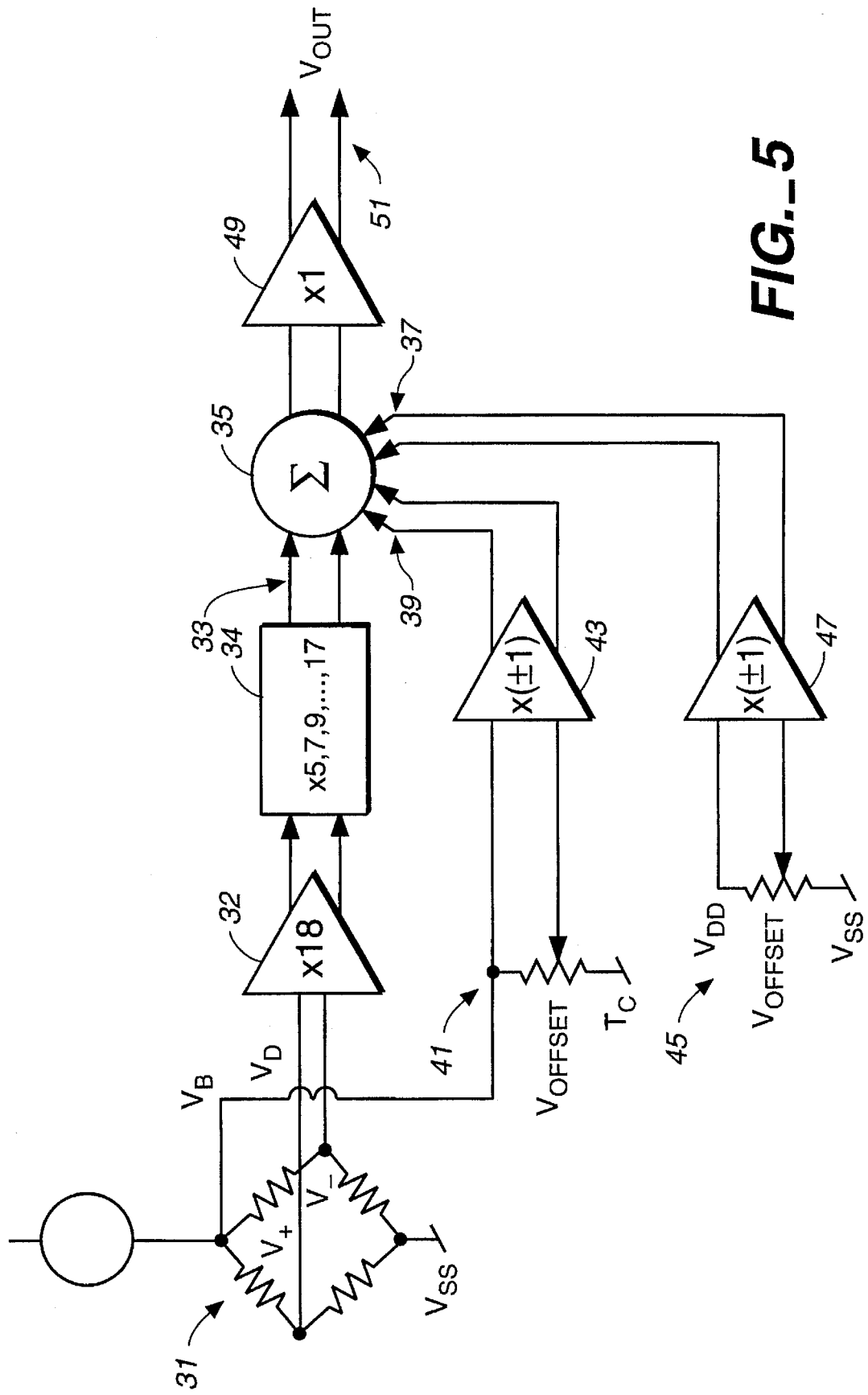
FIG._5

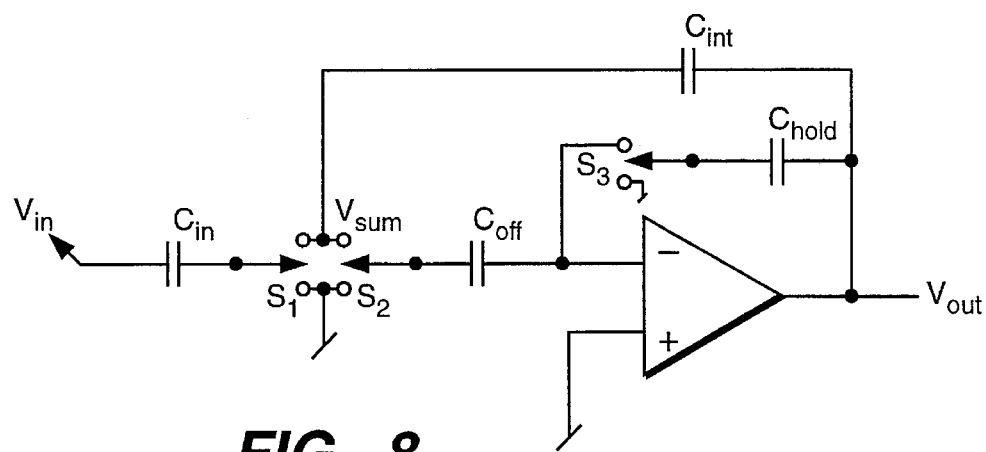
FIG._8
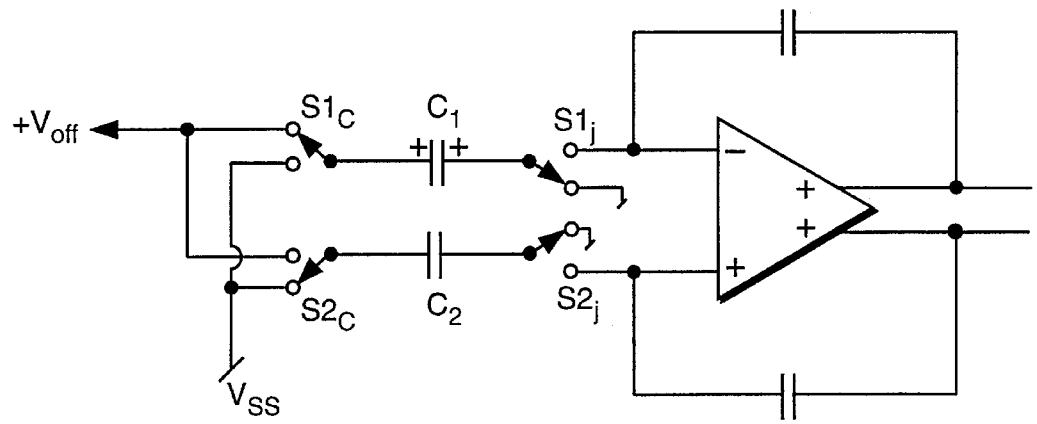
FIG._9
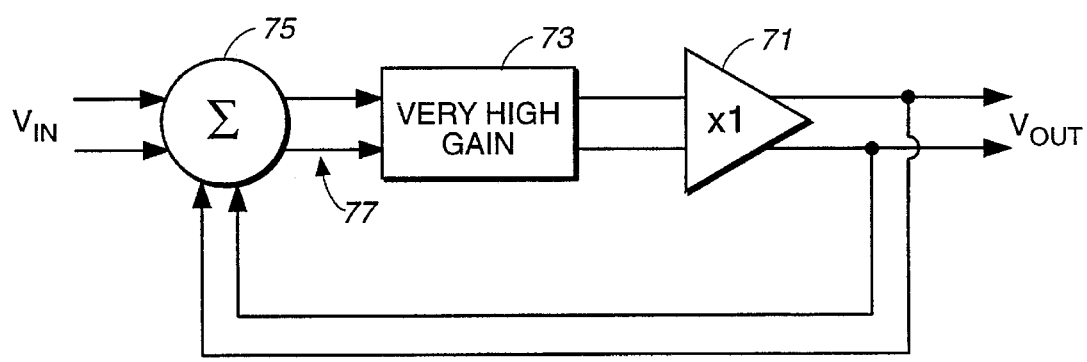
FIG._10

INSTRUMENTATION AMPLIFIER FOR SENSOR SIGNAL CONDITIONING USING LOW-COST, HIGH-ACCURACY ANALOG CIRCUITRY

BACKGROUND OF THE INVENTION

1. Field of the Invention

The present invention relates to instrumentation amplifiers, more particularly to instrumentation amplifiers for sensor signal conditioning using compensation circuits for performing temperature compensation of sensor output signals.

2. State of the Art

Sensors and transducers convert physical variables (such as pressure) into an electrical signal. Sensors are often the critical components in determining the feasibility of new products. Recent advances in silicon-based sensor have resulted in almost all new sensor applications being silicon-based. Silicon sensor technology is also displacing older technologies in traditional applications. Traditional applications of sensors include the automotive and medical industries, process and industrial controls, and military and aerospace applications. More recent applications include the consumer products market, communications, computer peripherals, product testing and factory automation.

A typical integrated-circuit pressure transducer is shown in FIG. 1 and FIG. 2. Referring to FIG. 1, diffused bridge resistors are formed on a semiconductor wafer and connected by metallization patterns in a bridge configuration. The bridge may be excited by applying across the bridge a potential E. The difference between a first potential $e_1$ and a second potential $e_2$ at opposite vertices of the bridge is indicative of the pressure being measured. As shown in FIG. 2, the semiconductor wafer is etched so as to form a pressure diaphragm. Variations in pressure cause various mounts of deflection of the pressure diaphragm.

Silicon exhibits an important electro-mechanical effect, piezoresistivity. When a silicon is strained, its resistivity changes by a reproducible amount. When pressure from a gas or liquid deflects the thin pressure diaphragm, the strain induced causes a change in electrical resistance which can be sensed by external electronics.

The electrical properties of silicon are very temperature dependent. The sensitivity of the sensor, defined as the ratio of the change in transducer output to a change in the value of the measured (e.g., pressure), therefore changes with temperature. The span, or range, of a transducer is the range of measured values over which the transducer is intended to measure, specified by upper and lower limits. FIG. 3 shows the full-scale output voltage of a typical piezoresitive transducer (PRT) as a function of temperature. As may be observed, the relation between fullscale output voltage and temperature is highly non-linear. Consequently, most devices will operate accurately only over a limited temperature range. Typically, silicon sensors require temperature compensation. By incorporating appropriate temperature-independent circuitry with the sensor, the temperature range over which sensors will operate accurately can be extended substantially.

Various techniques are known for performing span temperature compensation of PRTs. One particularly advantageous method and implementation are disclosed in U.S. patent application Ser. No. 08/435,441 entitled Method and Apparatus for Sensor Signal Conditioning Using Low-Cost, High-Accuracy Analog Circuitry (Attorney's Docket No. 018018-001), filed on even date herewith, incorporated herein by reference.

In addition to span temperature compensation, offset compensation and offset temperature compensation are also required to fully compensate the output signal of a PRT. Offset compensation and offset temperature compensation ensure that when no input is applied to the PRT the output signal indicates a zero value at any operating temperature within compensation limits. Furthermore, the sensor output signal must be amplified to a level that is usable by external circuitry. The amplifier circuitry used to perform such amplification must itself exhibit high linearity and low temperature drift; otherwise, even perfect span temperature compensation will not be sufficient to achieve acceptable results.

Considerable effort has been devoted to achieving an instrumentation amplifier having high linearity and low temperature drift. Unfortunately, such efforts have most often resulted in amplifiers that are costly to manufacture and that exhibit less-than-ideal temperature drift.

A conventional instrumentation amplifier, shown in FIG. 4, consists of a pair of buffer amplifiers 21, 23 and a differential amplifier 25. The arrangement of FIG. 4 has the disadvantage that the results of any temperature drift in the buffer amplifiers 21, 23 is only magnified in the differential amplifier 25.

In order to enable the wide-spread use of PRTs over a variety of applications, many of which are cost-driven, there is needed an instrumentation amplifier for sensor signal conditioning that exhibits high linearity and low temperature drift and that uses low-cost, high-accuracy analog circuitry.

SUMMARY OF THE INVENTION

The present invention, generally speaking, provides for highly accurate correction of a sensor output using circuitry that is compact and inexpensive. In accordance with one embodiment of the invention, a differential amplifier circuit that exhibits low temperature drift and a wide dynamic range includes a differential amplifier having first and second input terminals, first and second circuit nodes operatively connected to the first and second input terminals, respectively, a differential input signal pair, first and second sampling capacitors each having a first capacitor plate and a second capacitor plate, and a switching circuit. During a first operational phase, the switching circuit connects the first plate of the first capacitor to a first input signal of the differential input signal pair, connects the first plate of the second capacitor to a second input signal of the differential input signal pair, and connects the second plates of the first and second capacitors to a reference voltage. During a second operational phase, the switching circuit connects the first plate of the first capacitor to the second input signal of the differential input signal pair, connects the first plate of the second capacitor to the first input signal of the differential input signal pair, and connects the second plates of the first and second capacitors to respective ones of the first and second circuit nodes. In accordance with another embodiment of the invention, a sensor correction circuit for producing a corrected sensor output signal includes the differential amplifier circuit previously described and a bridge sensor that produces as an output signal the differential input signal pair of the amplifier circuit. A portion of the bridge voltage is used to form a correction voltage used to correct the sensor output signal.

BRIEF DESCRIPTION OF THE DRAWING

The present invention may be further understood from the following description in conjunction with the appended drawing. In the drawing:

FIG. 1 is a plan view of a typical integrated-circuit pressure transducer;

FIG. 2 is a cross-section of the integrated-circuit pressure transducer of FIG. 1;

FIG. 3 is a graph illustrating the temperature-dependent characteristics of a typical integrated-circuit pressure sensor;

FIG. 4 is a schematic diagram of a conventional instrumentation amplifier;

FIG. 5 is a block diagram of an instrumentation amplifier in accordance with the present invention;

FIG. 6 is a simplified schematic diagram of the amplifier circuit of FIG. 5;

FIG. 7 is a timing diagram related to the amplifier circuit of FIG. 5;

FIG. 8 is a more detailed schematic diagram of the amplifier circuit of FIG. 5 illustrating an autozeroing feature;

FIG. 9 is a schematic diagram of the amplifier circuits 43, 47 of FIG. 5; and

FIG. 10 is a schematic diagram of the amplifier circuit 49 of FIG. 5.

DETAILED DESCRIPTION OF THE PREFERRED EMBODIMENTS

In the following description of the present instrumentation amplifier, numerous specific details are set forth, such as specific circuitry, component values, etc., in order to provide a thorough understanding of the present invention. It will be obvious, however, to one skilled in the art that these specific details need not be employed to practice the present invention. In other instances, well-known circuits are not described in detail in order not to unnecessarily obscure the present invention.

In order to design a highly-accurate, low-cost, sensor output conditioning system, the inventor has exhaustively characterized various families of PRTs. In performing such characterization, it has been discovered that the shape of the offset voltage curve of a particular PRT as a function of temperature closely corresponds to the shape of the bridge voltage as a function of temperature. In performing offset voltage temperature compensation, therefore, this relationship is used to advantage by deriving a compensating voltage from the bridge voltage and summing this compensating voltage with the uncompensated sensor output voltage as follows:

$$V_{outTC} = V_{out} \pm \alpha V_b$$

Referring to FIG. 5, a bridge PRT sensor 31 is operated in a current excitation mode in which a fixed current is input to the bridge. The sensor output voltage, $V_D$, is taken at opposite nodes of the bridge and is amplified in a first differential amplifier stage 32 having a fixed gain factor and is further amplified in a second differential amplifier stage 34 having a variable gain factor. The resulting differential voltage signal 33 is input to a summing junction 35. Also input to the summing junction are a differential voltage signal 37 representing an offset voltage and a differential voltage signal representing an offset voltage temperature correction factor 39.

The offset voltage temperature correction factor, as previously described, is derived from the bridge voltage $V_b$. A potentiometer 41 is used to divide $V_b$ in accordance with an adjustable ratio to produce a voltage $V_{offsetTC}$. The voltage $V_{offsetTC}$ and ground form a differential input voltage to an amplifier 43, which applies to that differential voltage a gain of either 1 or −1. The resulting differential voltage signal 39, representing the offset voltage temperature correction factor, is input to the summing junction 33.

The offset voltage is produced in a similar fashion. A potentiometer 45 is used to divide, rather than $V_b$, $V_{dd}$, in accordance with an adjustable ratio to produce a voltage $V_{offset}$. The voltage $V_{offset}$ and ground form a differential input voltage to an amplifier 47, which applies to that differential voltage a gain of either 1 or−1. The resulting differential voltage signal 37, representing the offset voltage, is input to the summing junction 33.

At the summing junction 33, the sensor output voltage $V_D$, the offset voltage temperature correction factor $V_{offsetTC}$, and the offset voltage $V_{offset}$ are summed together to produce a corrected output signal $V_{out}$, which is buffered by a buffer amplifier 49 to produce a final output voltage signal 51, $V_{out}$.

Referring to FIG. 6, the fixed-gain amplifier 32, rather than using drift-prone buffer amplifiers as in the prior an (FIG. 4), uses switched capacitors. The use of switched capacitors eliminates problems of temperature drift found in the prior art and makes the circuit readily realizable in inexpensive CMOS technology. First and second sampling capacitors C1 and C2 are used to sample the sensor output voltage and apply the sensor output voltage to a fully-differential amplifier 61.

More particularly, during a first operational phase, the capacitor C 1 is connected by a switch $S1_c$ to a node V+ of the bridge and the capacitor C2 is connected by a switch $S2_c$ to a node V− of the bridge. Both the capacitor C 1 and the capacitor C2 are connected by respective switches $S1_j$ and $S2_j$ to ground. During a second operational phase, the switches $S1_c$ and $S2_c$ are reversed such that the capacitor C1 is connected to the node V− of the bridge and the capacitor C2 is connected to the node V+ of the bridge. The switches $S1_j$ and $S2_j$ are also reversed, connecting the capacitor C1 and the capacitor C2 to respective terminals of the differential amplifier.

In switching between the first and second operational phases, care is taken to ensure that the sample charges on the capacitors C 1 and C2 are not significantly disturbed. This result is accomplished, as illustrated in FIG. 7, by switching the switches $S1_j$ and $S2_j$ slightly in advance of the switches $S1_c$ and $S2_c$. Before the respective potentials on plates are changed, therefore, the respective charges on the capacitors C1 and C2 are frozen by opening the switches $S1_j$ and $S2_j$. With the plates effectively connected to open circuits, the respective charges on the capacitors C1 and C2 cannot change.

The nature of the sampling capacitors results in an amplifier circuit that exhibits both high common mode rejection and wide dynamic range. Furthermore, using the switching arrangement as shown, because the differential voltage is sampled twice, the gain of the amplifier circuit is effectively doubled. Although the amplifier circuit does draw some current, because of the high input impedance of amplifier circuit compared to the bridge impedance, the loading effect on the bridge is negligible. Using the described switching arrangement, a very high common mode rejection ratio (rail to rail common mode rejection ratio greater than 120 dB ) is achieved.

The performance of the amplifier circuit of FIG. 6 may be further improved by providing for autozeroing of the amplifier circuit as shown in FIG. 8. Although FIG. 8, for the sake of simplicity, shows a single-ended circuit, the corresponding fully-differential circuit will be readily apparent to one of ordinary skill in the art.

The provision of autozeroing requires the addition of, for each sampling capacitor, two additional capacitors and two switches. An offset capacitor $C_{offset}$ is added in series with the input terminal of the amplifier. A capacitor $C_{hold}$ is added between the output terminal of the amplifier and its input terminal.

During the first operational phase, the sampling capacitor $C_{in}$ and the offset capacitor $C_{offset}$ are connected to ground through switches S1 and S2. An integrating capacitor $C_{int}$ of the amplifier is switched to an open-circuit condition by switches S1 and S2 in order to preserve its previous state of charge. In order to maintain stability, the capacitor $C_{hold}$ is connected between the amplifier input and output terminals by a switch S3. During this phase of operation, the offset capacitor $C_{offset}$ charges to the offset voltage of the amplifier.

During the second operational phase, the sampling capacitor $C_{in}$, the integrating capacitor $C_{int}$, and the offset capacitor $C_{offset}$ are connected together at an artificial summing junction $V_{sum}$ through switches S1 and S2. With the integrating capacitor of the amplifier connected between the artificial summing junction and the amplifier output terminal through switches S1 and S2, the previous state of charge is restored. The capacitor $C_{hold}$ is connected to ground by switch S3. During this phase of operation, the offset voltage of the amplifier stored on the offset capacitor $C_{offset}$ is subtracted from the input voltage stored on the sampling capacitor $C_{in}$ in order to produce a true, autozeroed, output signal. This operation is done using a four phase clocking system to avoid disconnecting the integration capacitor at any time.

Referring again to FIG. 5, the fixed-gain amplifier stage 32 provides a basic level of amplification for the sensor output signal. Because of the extreme variability of sensor from manufacturer to manufacturer and from lot to lot, a variable gain stage 34 is provided to further amplify the sensor output signal in accordance with the requirements of the particular sensor. The variable-gain amplifier circuit 34 may be realized in substantially the same manner as the fixed-gain amplifier circuit of FIG. 6. Various gain factors are provided by switching different increments of capacitance in parallel with the sampling capacitors to effectively increase the size of the sampling capacitors.

Referring still to FIG. 5, the actual offset voltage and offset voltage temperature compensation factor may each be positive or negative. In order to produce positive or negative voltages from the positive voltages $V_b$ and $V_{dd}$, some means of voltage inversion is required. Typically, voltage inverters are realized using an inverting amplifier. Such amplifiers in practice do not achieve a gain of precisely unity and are therefore a source of error.

The amplifier circuits 43 and 47 of FIG. 5, on the other hand, produce a virtually perfect sign inversion using switched capacitors and phase reversal. Referring to FIG. 9, the amplifier circuits 43 and 47 are substantially similar to the amplifier circuit of FIG. 6 except that the sampled voltages, instead of V+ and V−, are $V_{offsetTC}$ and $V_{SS}$ in the case of the amplifier circuit and $V_{offset}$ and $V_{SS}$ in the case of the amplifier circuit.

To produce a voltage $+V_{offsetTC}$ or $+V_{offset}$, during a first operational phase, the capacitor C1 is connected by a switch $S1_c$ to $V_{offsetTC}$ or $V_{offset}$ and the capacitor C2 is connected by a switch $S2_c$ to $V_{SS}$. Both the capacitor C1 and the capacitor C2 are connected by respective switches $S1_j$ and $S2_j$ to ground. During a second operational phase, the switches $S1_c$ and $S2_c$ are reversed such that the capacitor C1 is connected to $V_{ss}$ and the capacitor C2 is connected to $V_{offsetTC}$ or $V_{offset}$. The switches $S1_j$ and $S2_j$ are also reversed, connecting the capacitor C1 and the capacitor C2 to respective terminals of the differential amplifier.

To produce the voltages $-V_{offsetTC}$ and $-V_{offset}$, the phases of the switches $S1_j$ and $S2_j$ are reversed. That is, during a first operational phase, the capacitor C1 is connected to $V_{SS}$ and the capacitor C2 is connected to $V_{offsetTC}$ or $V_{offset}$. Both the capacitor C1 and the capacitor C2 are connected by respective switches $S1_j$ and $S2_j$ to ground. During a second operational phase, the capacitor C1 is connected by a switch $S1_c$ to $V_{offsetTC}$ or $V_{offset}$ and the capacitor C2 is connected by a switch $S2_c$ to $V_{SS}$. The switches $S1_j$ and $S2_j$ are also reversed, connecting the capacitor C1 and the capacitor C2 to respective terminals of the differential amplifier.

Using the circuits previously described, the output voltage of a sensor may be corrected with high accuracy to produce a corrected output voltage $V_{out}$. In order to interface to the outside world, however, that output voltage must be buffered using a buffer amplifier such as the buffer amplifier 49 of FIG. 5 in order to drive a specified load. As with the previous amplifier circuits, if the buffer amplifier 49 exhibits poor linearity, then the accuracy of the sensor compensation circuitry will be compromised.

In CMOS technology, the type of linear, well-behaved components available in other technologies are not readily available. Instead CMOS offers good switches and good capacitors at very low cost. To realize the output buffer with good linearity, therefore, a feedback approach is used as shown in FIG. 10. A unity gain differential amplifier 71 that exhibits poor linearity is preceded by a very high-gain differential amplifier 73 of the type shown in FIG. 6. The high-gain differential amplifier 73 and the unity gain differential amplifier 71 are connected in a closed loop in which the output signal of the unity gain amplifier is subtracted from the input signal to the amplifier circuit at a summing junction 75. An error signal 77 is input to the high-gain differential amplifier. By action of the feedback loop, the error signal will be driven to zero, making the buffer amplifier 71 appear to be nearly ideal.

It will be appreciated by those of ordinary skill in the art that the invention can be embodied in other specific forms without departing from the spirit or essential character thereof. The presently disclosed embodiments are therefore considered in all respects to be illustrative and not restrictive. The scope of the invention is indicated by the appended claims rather than the foregoing description, and all changes which come within the meaning and range of equivalents thereof are intended to be embraced therein.

What is claimed is:

1. Apparatus comprising:

first and second circuit nodes;

a differential amplifier having first and second input terminals operatively connected to the first and second circuit nodes, respectively, and having first and second output terminals, a first integration capacitor connected between the first output terminal and the first circuit node, and a second integration capacitor connected between the second output terminal and the second circuit node;

a differential input signal pair;

first and second sampling capacitors each having a first capacitor plate and a second capacitor plate; and first switching means for:
  during a first operational phase, connecting the first plate of the first capacitor to a first input signal of the differential input signal pair, connecting the first plate of the second capacitor to a second input signal of the differential input signal pair, and connecting the second plates of the first and second capacitors to a reference voltage; and
  during a second operational phase, connecting the first plate of the first capacitor to the second input signal of the differential input signal pair, connecting the first plate of the second capacitor to the first input signal of the differential input signal pair, and connecting the second plates of the first and second capacitors to respective ones of the first and second circuit nodes;

a first offset capacitor connected between the first input terminal and the first circuit node;

a second offset capacitor connected between the second input terminal and the second circuit node;

a first holding capacitor connected between the first output terminal and the first input terminal; and a second holding capacitor connected between the second output terminal and the second input terminal.

2. The apparatus of claim 1, further comprising second switching means for:
  during the first operational phase, connecting the first and second circuit nodes to the reference voltage and disconnecting the first and second integration capacitors from the first and second circuit nodes, respectively; and
  during the second operational phase, disconnecting the first and second circuit nodes from the reference voltage, reconnecting the first and second integration capacitors to the first and second circuit nodes, respectively, disconnecting the first and second hold capacitors from the first and second input terminals, respectively, and connecting the first and second hold capacitors instead to the reference voltage.

3. The apparatus of claim 1, further comprising:
  first means for producing a first differential correction voltage; and
  summing means for summing an output voltage of the differential amplifier and the first differential correction voltage to produce a corrected differential output signal.

4. The apparatus of claim. 3, further comprising:
  second means for producing a second differential correction voltage;
  wherein the summing means is for summing the output voltage of the differential amplifier, the first differential connection voltage, and the second differential correction voltage.

5. The apparatus of claim 4, wherein the first means for producing a first differential correction voltage and the second means for producing a second differential correction voltage each comprises voltage inverter means.

6. The apparatus of claim 5, wherein said voltage inverter means comprises:
  a differential amplifier having first and second input terminals;
  first and second circuit nodes operatively connected to the first and second input terminals, respectively;
  a differential input signal pair;
  first and second sampling capacitors each having a first capacitor plate and a second capacitor plate; and
  correction voltage switching means for:
    during a first operational phase, connecting the first plate of the first capacitor to a first input signal of the differential input signal pair, connecting the first plate of the second capacitor to a second input signal of the differential input signal pair, and connecting the second plates of the first and second capacitors to a reference voltage; and
    during a second operational phase, connecting the first plate of the first capacitor to the second input signal of the differential input signal pair, connecting the first plate of the second capacitor to the first input signal of the differential input signal pair, and connecting the second plates of the first and second capacitors to respective ones of the first and second circuit nodes.

7. The apparatus of claim 4, further comprising:
  buffer amplifier means connected to the corrected differential output signal.

8. The apparatus of claim 7, wherein the buffer amplifier means comprises:
  a high-gain differential amplifier;
  a differential buffer amplifier connected in series with the high-gain differential amplifier; and
  summing means connected to the corrected differential output signal, to an input signal of the high-gain differential amplifier, and to an output signal of the differential buffer amplifier, for subtracting the output signal of the differential buffer amplifier from the connected differential output signal to produce a differential error signal and for inputting the differential error signal to the high-gain differential amplifier.

9. A sensor correction circuit for producing a corrected sensor output signal, comprising:
  a bridge sensor coupled to a reference voltage and producing a differential output signal pair including a first signal and a second signal, the first and second signals being of different magnitudes when the bridge sensor is placed under load;
  a differential amplifier having first and second input terminals;
  first and second circuit nodes operatively connected to the first and second input terminals, respectively;
  first and second sampling capacitors each having a first capacitor plate and a second capacitor plate; and
  first switching means for:
    during a first operational phase, connecting the first plate of the first capacitor to the first signal of the differential output signal pair, connecting the first plate of the second capacitor to the second signal of the differential output signal pair, and connecting the second plates of the first and second capacitors to the reference voltage; and
    during a second operational phase, connecting the first plate of the first capacitor to the second signal of the differential output signal pair, connecting the first plate of the second capacitor to the first signal of the differential output signal pair, and connecting the second plates of the first and second capacitors to respective ones of the first and second circuit nodes.

10. The apparatus of claim 9, wherein the differential amplifier comprises first and second output terminals, a first integration capacitor connected between the first output terminal and the first circuit node, and a second integration capacitor connected between the second output terminal and the second circuit node.

11. The apparatus of claim 10, further comprising a first offset capacitor connected between the first input terminal and the first circuit node, and a second offset capacitor connected between the second input terminal and the second circuit node.

12. The apparatus of claim 11, further comprising a first holding capacitor connected between the first output terminal and the first input terminal, and a second holding capacitor connected between the second output terminal and the second input terminal.

13. The apparatus of claim 12, further comprising second switching means for:

during the first operational phase, connecting the first and second circuit nodes to the reference signal and disconnecting the first and second integration capacitors from the first and second circuit nodes, respectively; and during the second operational phase, disconnecting the first and second circuit nodes from the reference voltage, reconnecting the first and second integration capacitors to the first and second circuit nodes, respectively, disconnecting the first and second hold capacitors from the first and second input terminals, respectively, and connecting the first and second hold capacitors instead to the reference voltage.

14. The apparatus of claim 9, further comprising:

a variable-gain differential amplifier having a plurality of control inputs used to select a gain setting from among a plurality of gain settings, connected to the output voltage of the differential amplifier and producing a further-amplified output voltage.

15. The apparatus of claim 14, further comprising:

first means for producing a first differential correction voltage; and summing means for summing the further-amplified output voltage and the first differential correction voltage to produce a corrected differential output signal.

16. The apparatus of claim 15, further comprising:

second means for producing a second differential correction voltage;

wherein the summing means is for summing the further-amplified output voltage, the first differential correction voltage, and the second differential correction voltage.

17. The apparatus of claim 16, wherein the first means for producing a first differential correction voltage and the second means for producing a second differential correction voltage each comprises voltage inverter means.

18. The apparatus of claim 17, wherein said voltage inverter means comprises:

a differential amplifier having first and second input terminals;

first and second circuit nodes operatively connected to the first and second input terminals, respectively;

a differential input signal pair;

first and second sampling capacitors each having a first capacitor plate and a second capacitor plate; and correction voltage switching means for:

during a first operational phase, connecting the first plate of the first capacitor to a first input signal of the differential input signal pair, connecting the first plate of the second capacitor to a second input signal of the differential input signal pair, and connecting the second plates of the first and second capacitors to a reference voltage; and during a second operational phase, connecting the first plate of the first capacitor to the second input signal of the differential input signal pair, connecting the first plate of the second capacitor to the first input signal of the differential input signal pair, and connecting the second plates of the first and second capacitors to respective ones of the first and second circuit nodes.

19. The apparatus of claim 18, wherein the first means for producing a first differential correction voltage comprises a voltage divider connected between a node of the bridge sensor and a reference voltage, and the differential input signal pair consists of a voltage produced at said node of the bridge sensor and a divided voltage produced by the voltage divider.

20. The apparatus of claim 18, wherein the second means for producing a first differential correction voltage comprises a voltage divider connected between a first reference voltage and a second reference voltage, and the differential input signal pair consists of the first reference voltage and a divided voltage produced by the voltage divider.

21. The apparatus of claim 16, further comprising:

buffer amplifier means connected to the corrected differential output signal.

22. The apparatus of claim 21, wherein the buffer amplifier means comprises:

a high-gain differential amplifier;

a differential buffer amplifier connected in series with the high-gain differential amplifier; and summing means connected to the corrected differential output signal, to an input signal of the high-gain differential amplifier, and to an output signal of the differential buffer amplifier, for subtracting the output signal of the differential buffer amplifier from the corrected differential output signal to produce a differential error signal and for inputting the differential error signal to the high-gain differential amplifier.

23. An amplifier for producing a differential correction voltage including voltage inverter means for, in a first mode of operation, producing a differential correction voltage of one polarity and for, in a second mode of operation, producing a differential correction voltage of an opposite polarity, wherein said voltage inverter means comprises:

a differential amplifier having first and second input terminals;

first and second circuit nodes operatively connected to the first and second input terminals, respectively;

a differential input signal pair;

first and second sampling capacitors each having a first capacitor plate and a second capacitor plate; and correction voltage switching means for, in said first mode of operation:

during a first operational phase, connecting the first plate of the first capacitor to a first input signal of the differential input signal pair, connecting the first plate of the second capacitor to a second input signal of the differential input signal pair, and connecting the second plates of the first and second capacitors to a reference voltage; and during a second operational phase, connecting the first plate of the first capacitor to the second input signal of the differential input signal pair, connecting the first plate of the second capacitor to the first input signal of the differential input signal pair, and connecting the second plates of the first and second capacitors to respective ones of the first and second circuit nodes; and for, in said second mode of operation:

during a first operational phase, causing the correction voltage switching means to connect the first plate of the first capacitor to the second input signal of the differential input signal pair, connect the first plate of the second capacitor to the first input signal of the differential input signal pair, and connect the second plates of the first and second capacitors to a reference voltage; and during a second operational phase, connecting the first plate of the first capacitor to the first input signal of the differential input signal pair, connecting the first plate of the second capacitor to the second input signal of the differential input signal pair, and connecting the second plates of the first and second capacitors to respective ones of the first and second circuit nodes.

* * * * *